US006025707A

United States Patent [19]

Joo

[11] Patent Number: 6,025,707
[45] Date of Patent: Feb. 15, 2000

[54] INTERNAL VOLTAGE GENERATOR

[75] Inventor: Yang Sung Joo, Seoul, Rep. of Korea

[73] Assignee: LG Semicon Co., Ltd., Chungcheongbuk-do, Rep. of Korea

[21] Appl. No.: 09/276,115

[22] Filed: Mar. 25, 1999

[30] Foreign Application Priority Data

Dec. 8, 1998 [KR] Rep. of Korea ........................ 98/5368

[51] Int. Cl.[7] .............................. G05F 1/56; H03K 5/153
[52] U.S. Cl. .............................................. 323/283; 327/77
[58] Field of Search .................................... 323/313, 282, 323/283, 266, 273; 327/77, 90, 97

[56] References Cited

U.S. PATENT DOCUMENTS

| | | | |
|---|---|---|---|
| 5,528,192 | 6/1996 | Agiman | 327/374 |
| 5,736,877 | 4/1998 | Tihanyi | 327/77 |
| 5,909,402 | 6/1999 | Joo | 365/189.07 |

OTHER PUBLICATIONS

Masashi Horiguchi et al., IEEE Journal of Solid–State Circuits, Vol. 23, No. 5, Oct. 1988.

*Primary Examiner*—Matthew Nguyen
*Attorney, Agent, or Firm*—Birch, Stewart, Kolasch & Birch, LLP

[57] ABSTRACT

Disclosed is an internal voltage generator for applying stable working voltage to an internal circuit. The internal voltage generator comprises: a reference voltage generator for generating a reference voltage; a comparator for comparing the reference voltage with an internal voltage input into the internal circuit; a first switching element controlled by an output voltage of the comparator and coupled between a supply voltage terminal and an internal voltage input terminal in the internal circuit; a second switching element arranged in parallel with the first switching element and coupled between the supply voltage terminal and the internal voltage input terminal in the internal circuit; and an internal voltage controller for controlling a level of the internal voltage input into the internal circuit by controlling ON/OFF state of the second switching element according to an active mode and a standby mode.

15 Claims, 5 Drawing Sheets

INTERNAL VOLTAGE GENERATOR

BACKGROUND OF THE INVENTION

1. Field of the Invention

The present invention relates to a semiconductor device and more particularly to an internal voltage generator for allowing stable voltage supply to an internal circuit.

2. Description of Related Art

With reference to the accompanying drawings, an internal voltage generator according to a conventional art will now be described.

FIG. 1 is a block diagram for showing a general idea of the conventional internal voltage generator.

As shown in FIG. 1, a semiconductor device includes internal circuit 11 and internal voltage generation section 12 for applying a voltage to the internal circuit 11.

The internal voltage generation section 12 converts an external supply voltage (Vcc) into an internal supply voltage (Vint) before supplying the voltage to the internal circuit 11.

Such internal voltage generator as shown in FIG. 1 is a down-converted voltage generator that does not immediately apply the external supply voltage (Vcc) to the internal circuit 11 but converts the external supply voltage (Vcc) into the internal voltage (Vint) before supply to the internal circuit 11. Therefore, the internal voltage (Vint) that is equal to or lower than the external supply voltage (Vcc) is supplied to the internal circuit 11 in this down-converted voltage generator.

As illustrated, the voltage is stably supplied to the internal circuit, so the internal circuit 11 becomes insensitive to the external supply voltage, thus stably operating.

There are also advantages of protecting the internal circuit 11 from over-supplied external voltage and reducing power consumption.

FIG. 2 illustrates a first embodiment of the internal voltage generator according to the conventional art.

The device shown in FIG. 2 is an analog voltage generator, which comprises comparator 21, reference voltage generator 22, first drive transistor 23, and internal circuit 24.

The comparator 21 compares an internal voltage (Vint) applied to the internal circuit 24 with a reference voltage (Vref) output from the reference voltage generator 22.

The comparator 21 is constituted by a differential amplifier. The comparator 21 has an inverting terminal coupled to the reference voltage generator 22 and a non-inverting terminal coupled to an internal voltage input terminal of the internal circuit 24.

An output voltage (SCas) of the comparator 21 is applied to a gate as a control signal over the first drive transistor 23.

Such conventional analog voltage generator will be described with reference to a voltage waveform diagram shown in FIG. 3.

FIG. 3 shows voltage waveforms appearing in the internal voltage generator depicted in FIG. 2. It is assumed that the reference voltage (Vref) generated from the reference voltage generator 22 has the same level as an ideal internal voltage (Vint).

Primarily, the internal voltage (Vint) is consumed for the operation of the internal circuit 24. If the internal voltage is lower than the reference voltage (Vref), the output voltage (SCas) of the comparator 21 becomes lower. The lowered output voltage of the comparator 21 increases a value of a Vsg (a voltage flowing between a gate and a source) in the first drive transistor 23, thereby increasing driving power.

Charge thus inward flows from the external supply voltage, so the lowered internal voltage (Vint) increases.

On the other hand, if the internal supply voltage (Vint) is higher than the reference voltage (Vref), the output voltage (SCas) of the comparator 21 becomes higher, so the inflow of the charge from the external supply voltage is limited. Therefore, there is no further increase of the internal supply voltage.

Essentially, the internal supply voltage (Vint) has a feature of controlling the driving power of the first drive transistor 23 with an analog level so as to maintain the same level as the reference voltage (Vref).

FIG. 4 shows a configuration of an internal voltage generator according to a second embodiment of the conventional art.

Compared with the one depicted in FIG. 2, the internal voltage generator depicted in FIG. 4 further comprises buffer 25 for buffering the output of the comparator 21 and second drive transistor 26. An output terminal in the buffer 25 is connected to a gate of the second drive transistor 26.

The buffer 25 is composed of first inverter **25*a* and second inverter 2*b*** connected in serial.

Such internal voltage generator according to the second embodiment of the conventional art uses analog mode together with digital mode.

This structural feature will be described with reference to FIG. 5 showing voltage waveforms.

As shown in FIG. 5, if the internal supply voltage (Vint) applied to the internal circuit 24 is lower than the reference voltage (Vref), the output voltage (SCas) of the comparator 21 becomes lower.

The lowered output voltage of the comparator 21 increases the value of the Vsg of the first drive transistor 23, thus increasing the driving power.

Consequently, the external supply voltage (Vcc) flows into the internal supply voltage.

The lowered output of the comparator 21 becomes lower than a threshold voltage of the first inverter **25*a*, so an output of the second inverter 25*b*** becomes logic "0" finally.

Namely, a level of the output of the second inverter **25*b* becomes equal to a level of a grounding voltage (Vss), and a level of the Vsg of the second drive transistor 26** becomes equal to a level of the external supply voltage (Vcc).

Hence, the charge flows into the internal supply voltage (Vint) via the second drive transistor 26, thereby increasing the internal supply voltage (Vint).

If it is assumed that sizes of the first and second transistors 23 and 26 are equal to each other, the Vsg value of the second drive transistor 26 exceeds the Vsg value of the first drive transistor 23. The inflow of charge via the second drive transistor 26 is larger than the inflow of charge via the first drive transistor 23.

On the other hand, if the internal supply voltage (Vint) exceeds the reference voltage (Vref), the output voltage of the comparator 21 increases, decreasing the driving power of the first drive transistor 23.

The inflow of charge from the external supply voltage (Vcc) is thus limited.

In addition, the output of the comparator 21 becomes higher than the threshold voltage of the first inverter **25*a*, so the output of the second inverter 25*b*** becomes logic "1"

Consequently, the second drive transistor 26 becomes turned OFF, thus cutting off the charge flowing from the external supply voltage (Vcc) into the internal supply voltage (Vint).

Therefore, increase of the internal supply voltage (Vint) flowing into the internal circuit 24 is suppressed.

However, such conventional internal voltage generator has the following defects.

Primarily, in the first embodiment, it happens that the driving ability of the first drive transistor is limited. To enhance the driving ability of the first drive transistor, the size of the transistor should be larger, but this results in increase of the load of a voltage applied to the gate in the first drive transistor. Consequently, reply speed of a differential amplifier becomes lower. This causes a problem that a level of the internal supply voltage considerably drops when much internal supply voltage (Vint) is required for a short time.

In the second embodiment, the analog-digital internal voltage generator swings a voltage applied to the gate in the second drive transistor up to a full CMOS level, thus enhancing the driving ability of the second drive transistor.

However, it is highly possible that there occurs severe overshoot of the internal supply voltage (Vint). In other words, a buffer (a first inverter and a second inverter) for converting an analog level into a digital level is required for the voltage applied to the gate in the second drive transistor. The addition of the buffer causes time delay.

When the internal supply voltage (Vint) is lower than the reference voltage (Vref), so the voltage applied to the gate in the second drive transistor is equal to the grounding voltage, the second drive transistor is turned ON and supplies charge to the internal supply voltage. Since the second drive transistor is turned OFF via the comparator and buffer, the time delay is caused. The overshoot thus occurs in the internal supply voltage (Vint).

SUMMARY OF THE INVENTION

Accordingly, the present invention is directed to an internal voltage generator that substantially obviates one or more of the limitations and disadvantages of the related art.

An objective of the present invention is to provide an internal voltage generator for supplying stable internal voltage to an internal circuit according to operation mode.

Additional features and advantages of the invention will be set forth in the following description, and in part will be apparent from the description, or may be learned by practice of the invention. The objectives and other advantages of the invention will be realized and attained by the structure as illustrated in the written description and claims hereof, as well as the appended drawings.

To achieve these and other advantages, and in accordance with the purpose of the present invention as embodied and broadly described, an internal voltage generator for applying stable working voltage to an internal circuit comprises: a reference voltage generator for generating a reference voltage; a comparator for comparing the reference voltage with an internal voltage input into the internal circuit; a first switching element controlled by an output voltage of the comparator and coupled between a supply voltage terminal and an internal voltage input terminal in the internal circuit; a second switching element arranged in parallel with the first switching element and coupled between the supply voltage terminal and the internal voltage input terminal in the internal circuit; and an internal voltage controller for controlling a level of the internal voltage input into the internal circuit by controlling ON/OFF state of the second switching element according to an active mode and a standby mode.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENT

Reference will now be made in detail to the preferred embodiments of the present invention, examples of which are illustrated in the accompanying drawings.

With reference to the accompanying drawings, an internal voltage generator of the present invention will now be described.

Figure 1:
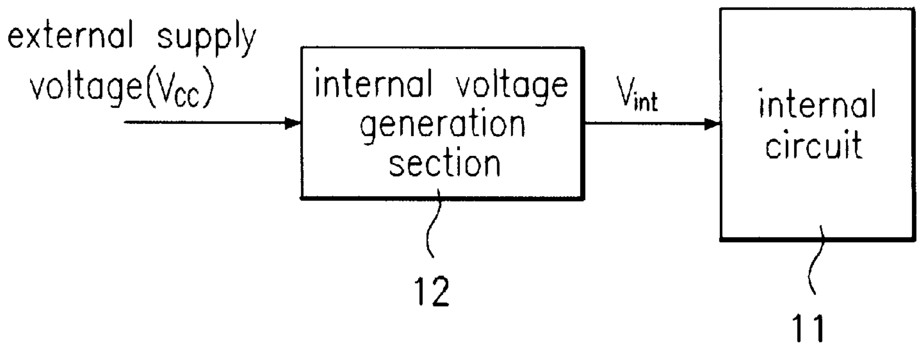
FIG.1 Related Art
FIG. 1 is a block diagram for showing a general idea of a conventional internal voltage generator.
Figure 2:
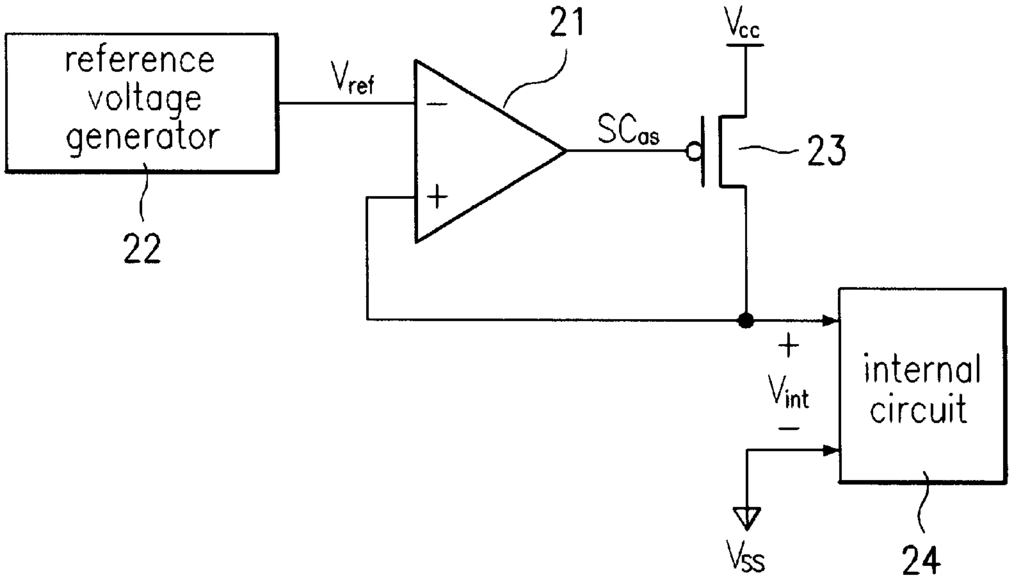
FIG.2 Related Art
FIG. 2 illustrates a first embodiment of an internal voltage generator according to a conventional art.
Figure 3:
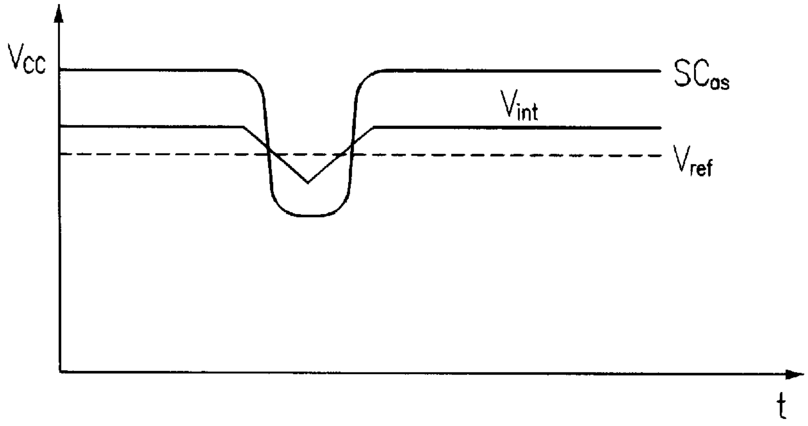
FIG.3 Related Art
FIG. 3 shows voltage waveforms appearing in the internal voltage generator depicted in FIG. 2.
Figure 4:
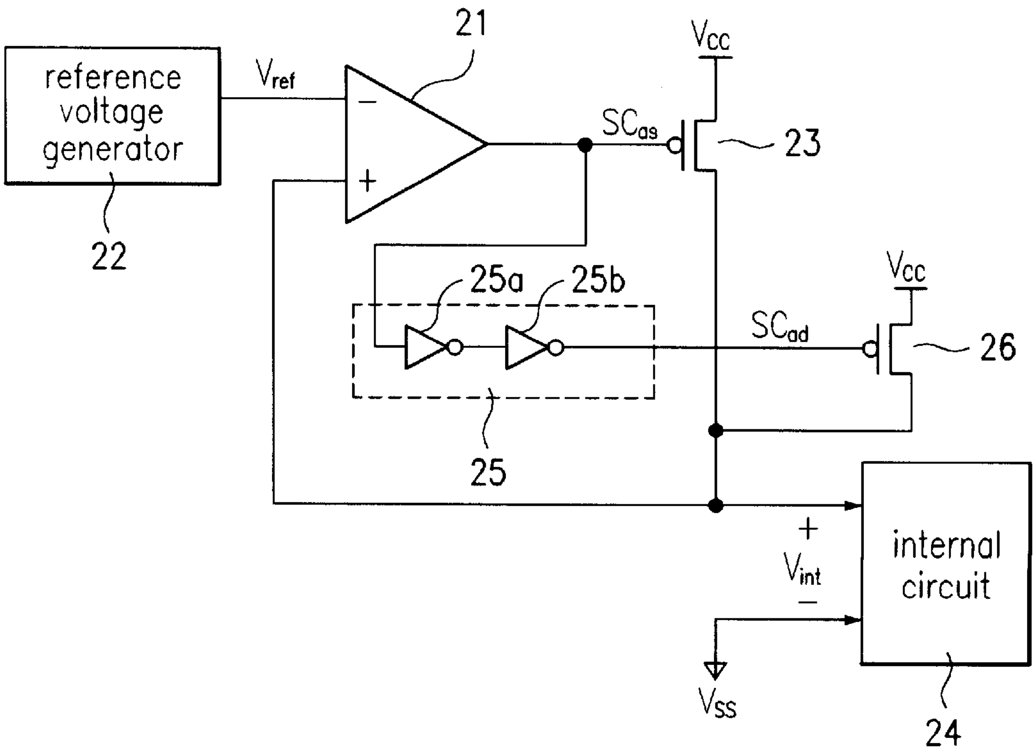
FIG.4 Related Art
FIG. 4 shows a configuration of an internal voltage generator according to a second embodiment of a conventional art.
Figure 5:
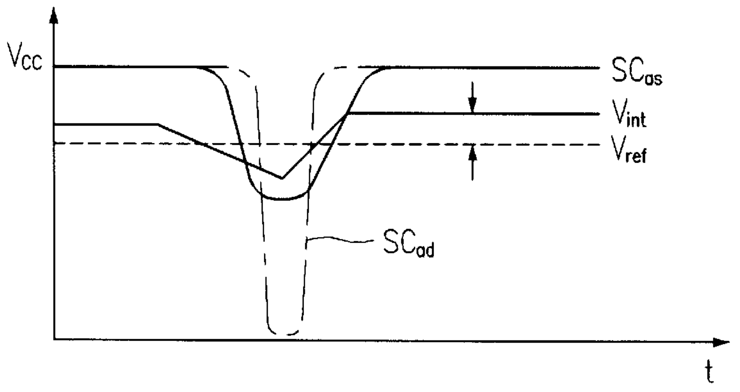
FIG.5 Related Art
FIG. 5 shows voltage waveforms appearing in the internal voltage generator depicted in FIG. 4.
Figure 6:
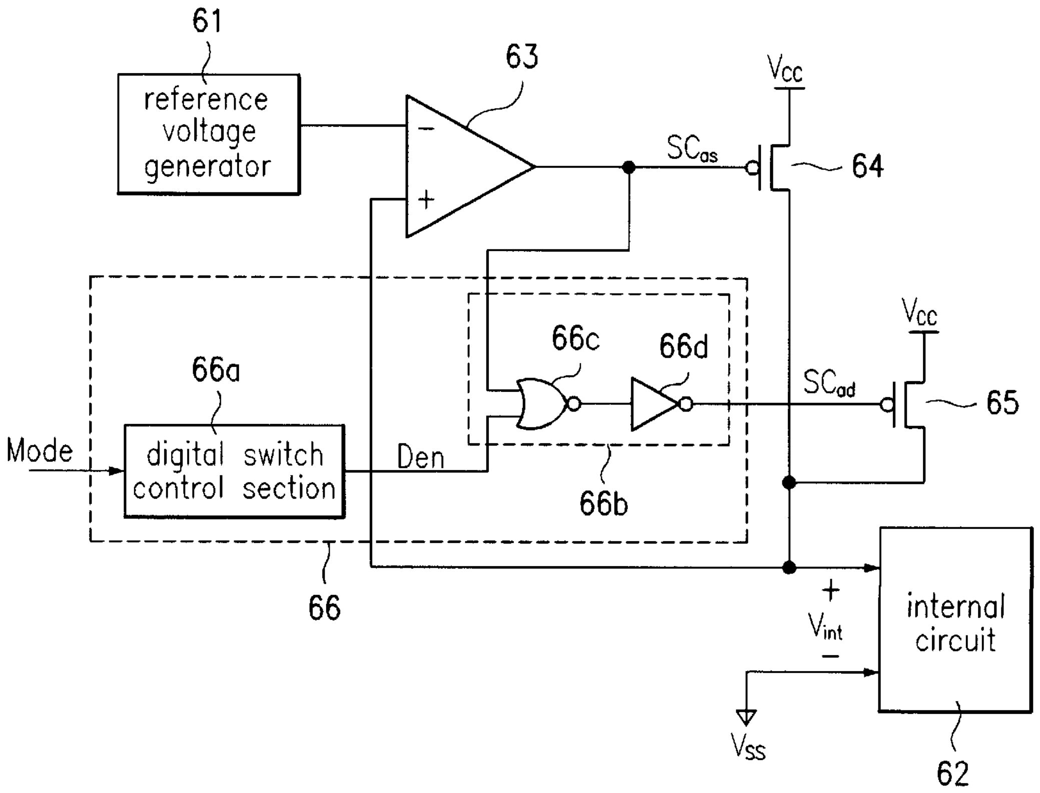
FIG. 6 illustrates a configuration of an internal voltage generator according to a first embodiment of the present invention.

FIG. 6 illustrates a configuration of the internal voltage generator according to a first embodiment of the present invention.

As shown in FIG. 6, the internal voltage generator according to the first embodiment comprises: reference voltage generator 61; internal circuit 62; comparator 63 for comparing an internal voltage input into the internal circuit 62 with a reference voltage output from the reference voltage generator 61; first switching element 64 controlled by an output voltage of the comparator 63 and coupled between an external supply voltage terminal and an internal voltage input terminal of the internal circuit 62; second switching element 65 coupled between the supply voltage terminal and the internal voltage input terminal of the internal circuit 62; and internal voltage controller 66 for controlling a level of the internal voltage input into the internal circuit 62 by controlling the second switching element 65 according to an active mode and a standby mode.

The first switching element 64 and the second switching element 65 are respectively constituted by P-MOS transistors.

In the description of the present invention hereinafter, the first switching element and the second switching element are respectively called first drive transistor 64 and second drive transistor 65.

In such internal voltage generator, the internal voltage controller comprises: digital switch control section 66*a* for producing "0" or "1" according to the active mode or standby mode; and logic operation section 66*b* disposed between an output terminal of the digital switch control section 66*a* and a gate of the second drive transistor 65.

The logic operation section 66*b* consists of; NOR gate 66*c* for performing a logic operation with respect to an output of the digital switch control section 66*a* and an output of the comparator 63; and inverter 66*d* for inverting an output of the NOR gate 66*c*.

An output of the inverter 66*d* is connected to the gate of the second drive transistor 65. The second drive transistor 65 is turned ON/OFF according to the output state of the inverter 66*d*.

The first drive transistor 64 and the second drive transistor 65 are constituted by PMOS transistors.

The comparator 63 is constituted by a differential amplifier. An inverting terminal of the differential amplifier is connected to the reference voltage generator 61 and a non-inverting terminal of the differential amplifier is connected to the internal voltage input terminal of the internal circuit 62.

According to such internal voltage generator of the present invention, time delay caused by the conventional buffer 25 can be prevented.

In other words, the time delay is caused by the buffer 25 in the conventional internal voltage generator. This is because the buffer 25 depends upon an output signal of the comparator 21.

However, the internal voltage generator according to the first embodiment of the present invention controls driving current in the active and standby modes according to an output signal of the digital switch control section 66*a* regardless of the output signal of the comparator 63.

Therefore, the digital switch control section outputs the logic "1" when the internal circuit 62 does not need a lot of current as in case of the standby mode, so high voltage is applied to the gate of the second drive transistor 65 regardless of the output signal of the comparator 63.

Once the high voltage is applied to the gate of the second drive transistor 65, the second drive transistor 65 is turned OFF so that the supply voltage cannot be applied to the internal circuit 62 any longer.

Consequently, when the active mode is converted into the standby mode, the time delay caused by the buffer 25 in the conventional art does not occur in the present invention.

Figure 7:
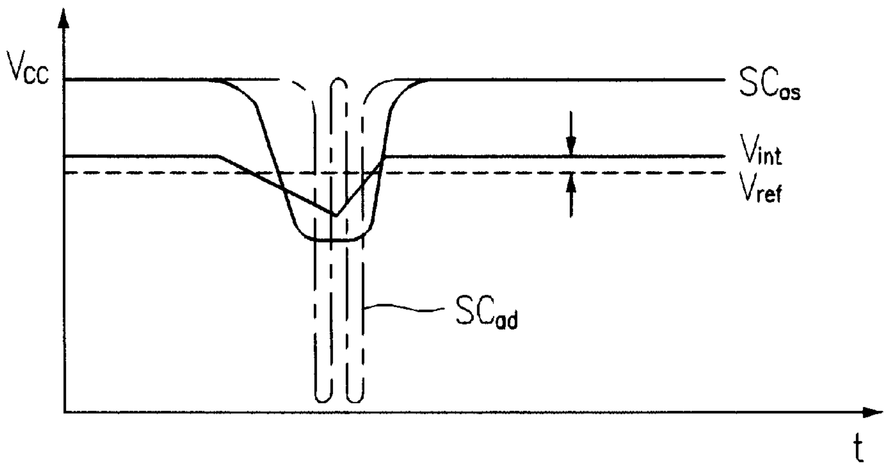
FIG. 7 shows voltage waveforms appearing in the internal voltage generator depicted in FIG. 6.

Such internal voltage generator according to the first embodiment of the present invention will now be described with reference to the voltage waveform diagram shown in FIG. 7.

The internal voltage generator according to the first embodiment of the present invention can eliminate overshoot caused by the second drive transistor by controlling the transistor according to the active or standby mode.

There is an occasion that a lot of current is consumed by the internal voltage. In this case, the current can be supplemented by activating the second drive transistor 65.

In other words, if the internal voltage (Vint) becomes lower than the reference voltage (Vref), so the output voltage of the comparator 63 becomes lower, the driving power of the first drive transistor 64 becomes greater, so a lot of current flows.

At this time, if the output signal of the digital switch control section 66*a* maintains the low state, the low signal is applied to the gate of the second drive transistor 65, so the external voltage is applied via the second drive transistor 65 so as to supplement the internal voltage.

The low or high state of the digital switch control section 66*a* depends upon an input mode signal.

As illustrated, when the internal circuit 62 needs a lot of current, the current can be supplemented via the first and second drive transistors 64 and 65.

On the other hand, if the internal voltage (Vint) becomes higher than the reference voltage (Vref), the output voltage of the comparator 63 becomes higher.

The high voltage is thus applied to the first and second drive transistors 64 and 65, so the first and second drive transistors 64 and 65 become turned OFF.

At this time, if the digital switch control section 66*a* maintains the high state, the high signal is always applied to the gate of the second drive transistor 65 regardless of the output voltage of the comparator 63.

Consequently, the second drive transistor 65 becomes turned ON/OFF depending upon the output signal of the digital switch control section 66*a* other than the output voltage of the comparator 63, thus removing unnecessary time delay.

Furthermore, the signal applied to the gate of the second drive transistor 65 can be input in the form of pulse to apply much steadier internal voltage.

Figure 8:
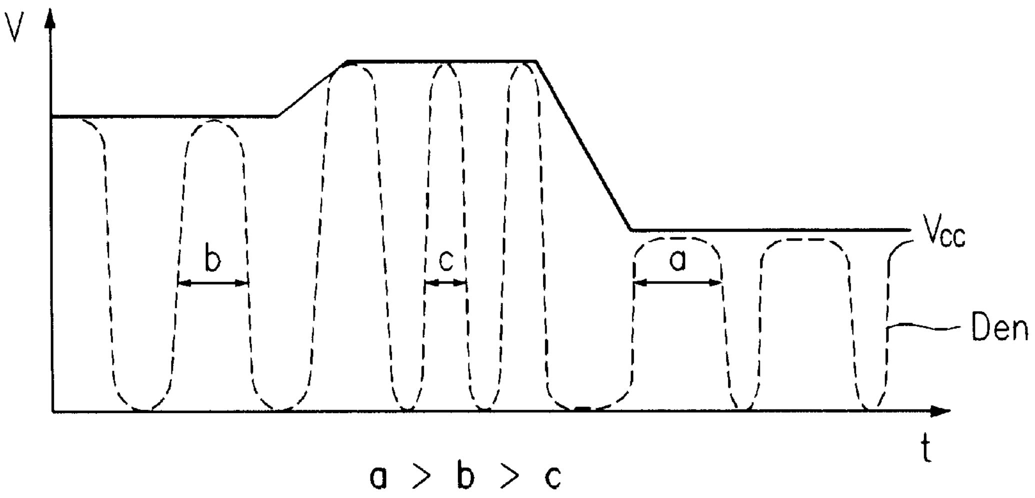
FIG. 8 shows output cycles of a digital switch controller depending upon the scale of supply voltage according to the present invention.

Specifically, if the signal of the pulse form, as shown in FIG. 8, is applied to the second drive transistor 65, the second drive transistor 65 is forced to repeatedly and periodically perform turn-ON and turn-OFF operations by the output of the comparator 63 and the digital switch control section 66*a*, thus reducing the overshoot. This can be applied to only the case that the internal voltage (Vint) is lower than the reference voltage (Vref).

When changing output waveform of the digital switch control section 66*a* depending upon the external voltage as shown in FIG. 8, the overshoot can be reduced much more.

In addition, when changing the output waveform of the digital switch control section 66*a* depending upon the internal voltage other than the external voltage as shown in FIG. 8, the overshoot can also be reduced.

Figure 9:
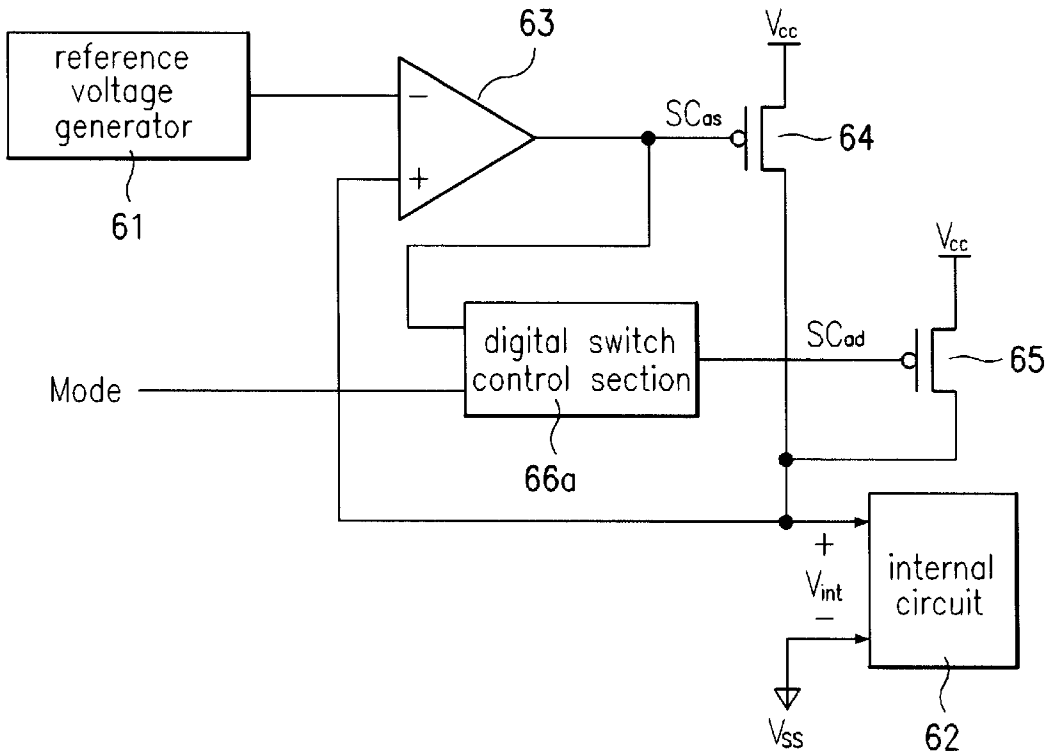
FIG. 9 shows a configuration of an internal voltage generator according to a second embodiment of the present invention.

FIG. 9 shows a configuration of an internal voltage generator according to a second embodiment of the present invention.

Compared with the internal voltage generator according to the first embodiment of the present invention, the internal voltage generator according to the second embodiment of the present invention as shown in FIG. 9 has the digital switch control section 66*a* disposed between the output terminal of the comparator 63 and the gate of the second drive transistor 65.

In the second embodiment, the internal voltage generator comprises: reference voltage generator 61; internal circuit 62; comparator 63 for comparing an internal voltage input into the internal circuit 62 with a reference voltage output from the reference voltage generator 61; first drive transistor 64 controlled by the output voltage of the comparator 63 and coupled between an external supply voltage terminal and an internal voltage input terminal of the internal circuit 62; second drive transistor 65 having a source coupled to the external supply voltage terminal and a drain coupled to the internal voltage input terminal of the internal circuit 62; and digital switch control section 66*a* for controlling a level of the internal voltage input into the internal circuit 62 by controlling ON/OFF of the second drive transistor 65 according to an active mode and a standby mode.

The digital switch control section 66*a* outputs "0" or "1" according to the present mode (the standby mode or the active mode).

Differently from the first embodiment, the second embodiment of the present invention does not have the logic operation section 66*b* but only the digital switch control section 66*a* as the internal voltage controller, thus constructing a short pulse generator having the same effect as the first embodiment of the present invention.

As illustrated above, the internal voltage generator according to the present invention turns OFF the digital switch when a lot of current is not needed as the case that the internal circuit is in the standby mode, thus reducing overshoot. In the active mode, the digital switch is turned ON, thus obtaining a lot of driving current.

Additionally, when a lot of driving current is required, the present invention allows an output signal of the digital switch to have a pulse form, thereby reducing the overshoot and realizing stable operation.

It will be apparent to those skilled in the art that various modifications and variations can be made in the internal voltage generator of the present invention without deviating from the spirit or scope of the invention. Thus, it is intended that the present invention covers the modifications and variations of this invention provided they come within the scope of the appended claims and their equivalents.

What is claimed is:

1. An internal voltage generator for applying stable working voltage to an internal circuit, said internal voltage generator comprising:

- a reference voltage generator for generating a reference voltage;
- a comparator for comparing said reference voltage with an internal voltage input into said internal circuit;
- a first switching element controlled by an output voltage of said comparator and coupled between a supply voltage terminal and an internal voltage input terminal in said internal circuit;
- a second switching element arranged in parallel with said first switching element and coupled between said supply voltage terminal and the internal voltage input terminal in said internal circuit; and
- an internal voltage controller for controlling a level of the internal voltage input into said internal circuit by controlling said second switching element according to an active mode and a standby mode.

2. An internal voltage generator according to claim 1, wherein said first and second switching elements are constituted by transistors.

3. An internal voltage generator for applying stable working voltage to an internal circuit, said internal voltage generator comprising:

- a reference voltage generator for generating a reference voltage;
- a comparator for comparing said reference voltage with an internal voltage input into said internal circuit;
- a first transistor controlled by an output voltage of said comparator and coupled between a supply voltage terminal and an internal voltage input terminal in said internal circuit;
- a second transistor having a drain coupled to said supply voltage terminal and a source coupled to said internal voltage input terminal in said internal circuit;
- a digital switch control section for outputting a control signal according to an active mode and a standby mode; and
- a logic operation section for performing a logic operation with respect to said control signal and the output of said comparator and applying a result value of the operation to a gate of said second transistor.

4. An internal voltage generator according to claim 3, wherein said logic operation section comprises:

- a NOR gate for performing the logic operation with respect to said control signal and the output of said comparator; and
- an inverter for inverting an output of said NOR gate.

5. An internal voltage generator according to claim 3, wherein said first and second transistors are P-MOS transistors.

6. An internal voltage generator according to claim 3, wherein an output cycle or duty ratio of said digital switch control section is limited depending upon a scale of the supply voltage.

7. An internal voltage generator according to claim 6, wherein the output cycle of said digital switch control section is large when said supply voltage is small, and the output cycle of said digital switch control section is small when said supply voltage is large.

8. An internal voltage generator according to claim 3, wherein an output cycle or duty of said logic operation section is limited depending upon a scale of the supply voltage.

9. An internal voltage generator according to claim 8, wherein the output cycle of said logic operation section is large when said supply voltage is small, and the output cycle of said logic operation section is small when said supply voltage is large.

10. An internal voltage generator according to claim 3, wherein said second transistor is turned ON in the active mode, so the supply voltage is applied to the internal voltage input terminal of said internal circuit, and said second transistor is turned OFF in the standby mode, so the supply voltage is not applied to said internal circuit.

11. An internal voltage generator for applying stable working voltage to an internal circuit, said internal voltage generator comprising:

- a reference voltage generator for generating a reference voltage;
- a comparator for comparing said reference voltage with an internal voltage input into said internal circuit;
- a first transistor controlled by an output voltage of said comparator and coupled between an external supply voltage terminal and an internal voltage input terminal in said internal circuit;
- a second transistor coupled between said external voltage terminal and said internal voltage input terminal in said internal circuit; and
- a digital switch control section for applying logic "0" or "1" to said second transistor in response to the output of said comparator in an active mode or a standby mode.

12. An internal voltage generator according to claim 11, wherein said first and second transistors are P-MOS transistors.

13. An internal voltage generator according to claim 11, wherein an output cycle or duty ratio of said digital switch control section is limited depending upon a scale of the supply voltage.

14. An internal voltage generator according to claim 13, wherein the output cycle of said digital switch control section is large when said supply voltage is small, and the output cycle of said digital switch control section is small when said supply voltage is large.

15. An internal voltage generator according to claim 11, wherein said second transistor is turned ON in the active mode, so the supply voltage is applied to the internal voltage input terminal of said internal circuit, and said second transistor is turned OFF in the standby mode, so the supply voltage is not applied to said internal circuit.

* * * * *